US010985707B2

United States Patent
Aktug et al.

(10) Patent No.: US 10,985,707 B2
(45) Date of Patent: Apr. 20, 2021

(54) ACTIVE LIMITING SYSTEM

(71) Applicant: ASELSAN ELEKTRONIK SANAYI VE TICARET ANONIM SIRKETI, Ankara (TR)

(72) Inventors: Ahmet Aktug, Ankara (TR); Cagdas Yagbasan, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 0 days.

(21) Appl. No.: 16/617,530

(22) PCT Filed: Dec. 4, 2017

(86) PCT No.: PCT/TR2017/050625
§ 371 (c)(1),
(2) Date: Nov. 27, 2019

(87) PCT Pub. No.: WO2019/112523
PCT Pub. Date: Jun. 13, 2019

(65) Prior Publication Data
US 2020/0091872 A1    Mar. 19, 2020

(51) Int. Cl.
*H03F 1/52*      (2006.01)
*H03G 11/02*   (2006.01)
(Continued)

(52) U.S. Cl.
CPC ............... *H03F 1/52* (2013.01); *H03F 1/26* (2013.01); *H03F 3/195* (2013.01); *H03G 11/02* (2013.01);
(Continued)

(58) Field of Classification Search
CPC .................... H03F 1/52; H03G 11/02
(Continued)

(56) References Cited

U.S. PATENT DOCUMENTS 5,300,900 A * 4/1994 Bellantoni ........... H03G 11/025
327/309
6,195,535 B1 2/2001 Kurchuk
(Continued)

FOREIGN PATENT DOCUMENTS

GB        2335558 A       9/1999

OTHER PUBLICATIONS

Jim Looney, David Conway, and Inder Bahl; An Examination of Recovery Time of an Integrated Limiter/LNA; Microwave Magazine; Mar. 2004; 83-86; vol. 5, Issue: 1; IEEE.

*Primary Examiner* — Patricia T Nguyen
(74) *Attorney, Agent, or Firm* — Bayramoglu Law Offices LLC

(57) ABSTRACT

An active limiting system that is suitable to protect a low noise amplifier against the high power signals received from a signal input includes, at least one first switch, source of which is connected to a gate voltage; at least first resistor which is connected between the gate and source of the first switch; at least one second resistor, which is connected between a drain voltage and drain of the first switch; at least one second switch, source of which is connected to said drain voltage and drain of which is connected to a signal input; at least one third resistor which is connected between the drain of the first switch and gate of the second switch; at least one first filtering element, which blocks DC currents/voltages and which is connected between the source of the second switch and ground.

8 Claims, 3 Drawing Sheets

(51) Int. Cl.
*H03F 1/26* (2006.01)
*H03F 3/195* (2006.01)
*H03G 11/04* (2006.01)

(52) U.S. Cl.
CPC ....... *H03G 11/04* (2013.01); *H03F 2200/294* (2013.01); *H03F 2200/372* (2013.01)

(58) Field of Classification Search
USPC ................................ 330/298, 296, 135, 136
See application file for complete search history.

(56) References Cited

U.S. PATENT DOCUMENTS

| | | |
|---|---|---|
| 6,747,484 B1 | 6/2004 | Adlerstein et al. |
| 7,002,413 B2* | 2/2006 | Tsunai ...................... H03F 1/12 330/310 |
| 7,345,547 B2* | 3/2008 | Wang ........................ H03F 1/30 330/285 |
| 9,755,587 B1 | 9/2017 | Arell |
| 2003/0201835 A1* | 10/2003 | Dening ..................... H03F 3/19 330/298 |
| 2006/0145765 A1* | 7/2006 | Honda ...................... H03F 1/30 330/296 |
| 2012/0249234 A1* | 10/2012 | Robert ................ H03F 3/45085 330/85 |
| 2013/0127544 A1* | 5/2013 | Murakami ................ H03F 1/02 330/296 |
| 2018/0026592 A1* | 1/2018 | Wallis ................. H04B 1/1607 330/302 |

* cited by examiner

ACTIVE LIMITING SYSTEM

CROSS REFERENCE TO THE RELATED APPLICATIONS

This application is the national phase entry of International Application No. PCT/TR2017/050625, filed on Dec. 4, 2017, the entire contents of which are incorporated herein by reference.

TECHNICAL FIELD

The present invention is related to an active limiting system capable of protecting an amplifier (especially a low noise amplifier) from high input power levels.

BACKGROUND

Low noise amplifiers (LNA) are electronic amplifiers that amplify the power level of low power signals. While the low noise amplifiers amplify the power level of the signal, they keep the noise level of the output signal as low as possible. In order to perform such amplification, low noise amplifiers usually comprise at least one transistor (such as HEMT).

Low noise amplifiers are generally used in radio communications systems. Since radio communication usually deals with low power signals (especially at the receiving end) low noise amplifiers used for the amplifying the power level of said low power signals. In the low noise amplifiers, in order to reduce the noise, sensitive components are used. Although said sensitive components are effective for reducing the noise level, they are generally vulnerable to the high power inputs. Although in the ideal cases, no high power signal is sent to the low noise amplifiers, it is possible that low noise amplifiers may be exposed to high power signals. For example in the radar applications, transmitted power may be reflected from antenna and low noise amplifier can be exposed to reflected high power through circulator. In another example, an electromagnetic bomb may generate high power signals to destroy the low noise amplifier.

Since low noise amplifiers are vulnerable against the high power signals, in the known art different protection systems are used for protecting the low noise amplifiers against the high power signals. One of the protection systems used in the known art is passive limiting circuits. An exemplary embodiment of said passive limiting circuits is disclosed in the paper Jim Looney et al. "*An Examination of Recovery Time of an Integrated Limiter/LNA*". Said passive limiting circuits comprise protecting elements that limit the voltage level of the input of the low noise amplifiers. Although said passive limiting systems limit the input power, they cause high noise levels. Therefore, when low noise is needed, said passive limiting systems are not preferred.

SUMMARY

In the present invention, an active limiting system that is suitable to protect a low noise amplifier against the high power signals received from a signal input is provided. Said active limiting system comprises, at least one first switch, source of which is connected to a gate voltage; at least first resistor which is connected between the gate and source of the first switch; at least one second resistor, which is connected between a drain voltage and drain of the first switch; at least one second switch, source of which is connected to said drain voltage and drain of which is connected to a signal input; at least one third resistor which is connected between the drain of the first switch and gate of the second switch; at least one first filtering element, which blocks DC currents/voltages and which is connected between the source of the second switch and ground.

In the present application, by using first switch and second switch, when a low power voltage signal is received from the signal input, said signal is directly sent to the low noise amplifier. On the other hand, when a high power voltage signal is received from the signal input, said high power signal is reflected back. Therefore, low noise amplifier is protected from the high power signals.

An object of the invention is to provide an active limiting system suitable protecting an amplifier from high input power levels.

The other object of the invention is to provide an active limiting system that is able to be produced with low noise amplifier on a single substrate.

Figure 1:
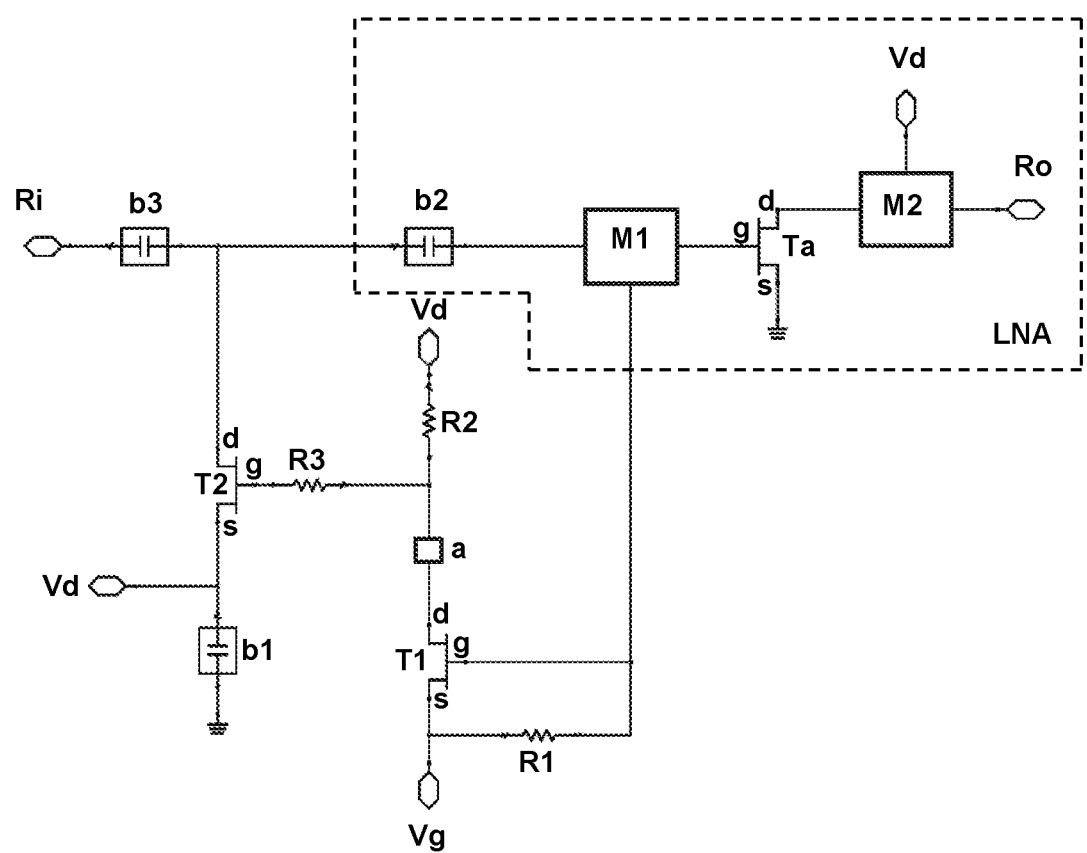
FIG. 1 shows an exemplary circuit diagram of the active limiting system of the present application.

All the parts illustrated in the drawing are individually assigned a reference numeral and the corresponding terms of these numbers are listed as follows:

Low noise amplifier (LNA)
First switch (T1)
Second switch (T2)
Amplifier transistor (Ta)
Signal input (Ri)
Signal output (Ro)
First resistor (R1)
Second resistor (R2)
Third resistor (R3)
Drain voltage (Vd)
Gate voltage (Vg)
Bias voltage (Vb)
First matching network (M1)
Second matching network (M2)
First filtering element (b1)
Second filtering element (b2)
Third filtering element (b3)
Volta damper (a)
Gate (g)
Source (s)
Drain (d)

DETAILED DESCRIPTION OF THE EMBODIMENTS

Low noise amplifiers amplify the power level of the low power signals with low noise levels. In order to keep the noise level as low as possible, sensitive components are used in the low noise amplifiers. Because of said sensitive components, low noise amplifiers are vulnerable against the high power inputs. Therefore, in the present application, an active limiting system that protects low noise amplifiers against the high power inputs is developed.

Figure 2:
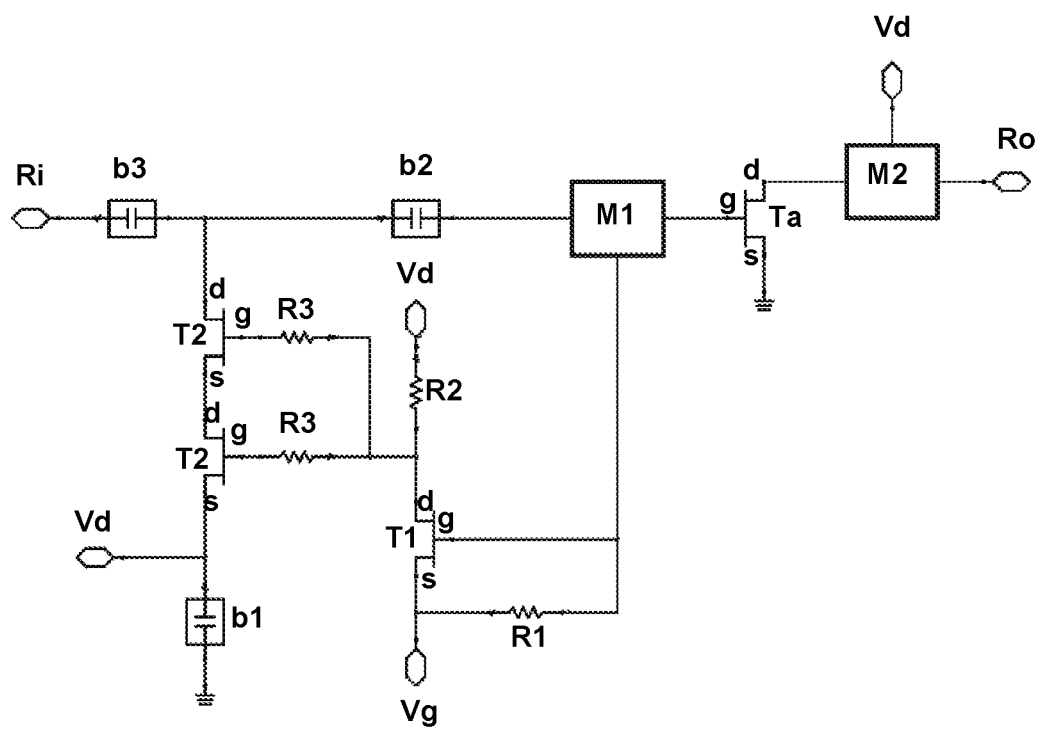
FIG. 2 shows another exemplary circuit diagram of the active limiting system of the present application.

The active limiting system of the present invention, exemplary views of which is shown in the FIGS. 1-2, comprises at least one first switch (T1), which is preferably in the form of HEMT, having at least one source (s), at least one gate (g) and at least one drain (d), and source (s) of which is connected to a gate voltage (Vg), wherein electrical connection between the source (s) and drain (d) of the first switch (T1) is controlled by the gate (g) to source (s) voltage of the first switch (T1); at least first resistor (R1) which is connected between the gate (g) and source (s) of the first switch (T1); at least one second resistor (R2), which is connected between a drain voltage (Vd) and drain (d) of the first switch (T1); at least one second switch (T2), which is preferably in the form of HEMT, having at least one source (s), at least one gate (g) and at least one drain (d), source (s) of which is connected to said drain voltage (Vd) and drain (d) of which is connected to a signal input (Ri), wherein electrical connection between the source (s) and drain (d) of the second switch (T2) is controlled by the gate (g) to source (s) voltage of the second switch (T2); at least one third resistor (R3) which is connected between the drain (d) of the first switch (T1) and gate (g) of the second switch (T2); at least one first filtering element (b1) (such as a capacitor), which blocks DC currents/voltages and which is connected between the source (s) of the second switch (T2) and ground.

In an exemplary embodiment of the present application, a low noise amplifier (LNA) is fed by a signal received from the signal input (Ri). In this embodiment, gate (g) of the first switch (T1) is connected to an amplifier transistor (Ta) of a low noise amplifier (LNA), through a first matching network (M1). Said low noise amplifier (LNA) may further comprises a drain voltage (Vd) and a gate voltage (Vg), a second matching network (M2), a second filtering element (b2) (such as a capacitor), which blocks DC currents/voltages and a signal output (Ro), wherein signal received from the signal input (Ri) is amplified by the amplifier transistor (Ta) and outputted from the signal output (Ro). In this embodiment, when the power level of the signal received from the signal input (Ri) is low, no current passes through the first resistor (R1). Therefore, gate (g) voltage and source (s) voltage of the first switch (T1) becomes equal to each other (which is gate voltage (Vg)) and first switch (T1) becomes in on state. In that state, second switch (T2) becomes in off state and signal received from the signal input (Ri) is not affected by the second switch (T2). On the other hand, when the power level of the signal received from the signal input (Ri) is high, a current passes through the first resistor (R1). Therefore, gate (g) voltage of the first switch (T1) becomes less than the source (s) voltage of the first switch (T1). This causes first switch (T1) to become off state. In this state, second switch (T2) becomes in on state and entrance impedance of the low noise amplifier (LNA) becomes disturbed. Accordingly, high power is reflected and low noise amplifier (LNA) is protected from said high power.

In a preferred embodiment of the present application, active limiting system comprises at least two second switch (T2) and at least two third resistor (R3), as shown in FIG. 2. In this embodiment, by using more than one second switch (T2), parasitic effects of the second switches (T2) are reduced.

In another preferred embodiment of the present application, active limiting system comprises at least one voltage damper (a) located between the second resistor (R2) and drain (d) of the first switch (T1). Said voltage damper (a) preferably comprises at least one (preferably two) diode in order to create a voltage difference between the second resistor (R2) and drain (d) of the first switch (T1). Thanks to said voltage difference, when the drain voltage (Vd) becomes 0 V, any input signal is almost immediately reflected back. Therefore, high power protection of the system is improved.

In another preferred embodiment of the present application, active limiting system comprises at least one third filtering element (b3) (such as a capacitor), which blocks DC currents/voltages and which is connected between the signal input (Ri) and drain (d) of the second switch (T2).

In the above mentioned embodiments, first switch (T1), second switch (T2) and second resistor (R2) are connected to drain voltage (Vd) and/or gate voltage (Vg) of the low noise amplifier (LNA). Therefore, no other input is necessary for the operation of the active limiting system. Moreover, said the active limiting system and the low noise amplifier (LNA) are able to be placed on the same chip. In alternative embodiments, said the active limiting system and the low noise amplifier (LNA) may be different components (such as in the form of distinct chips).

Figure 3:
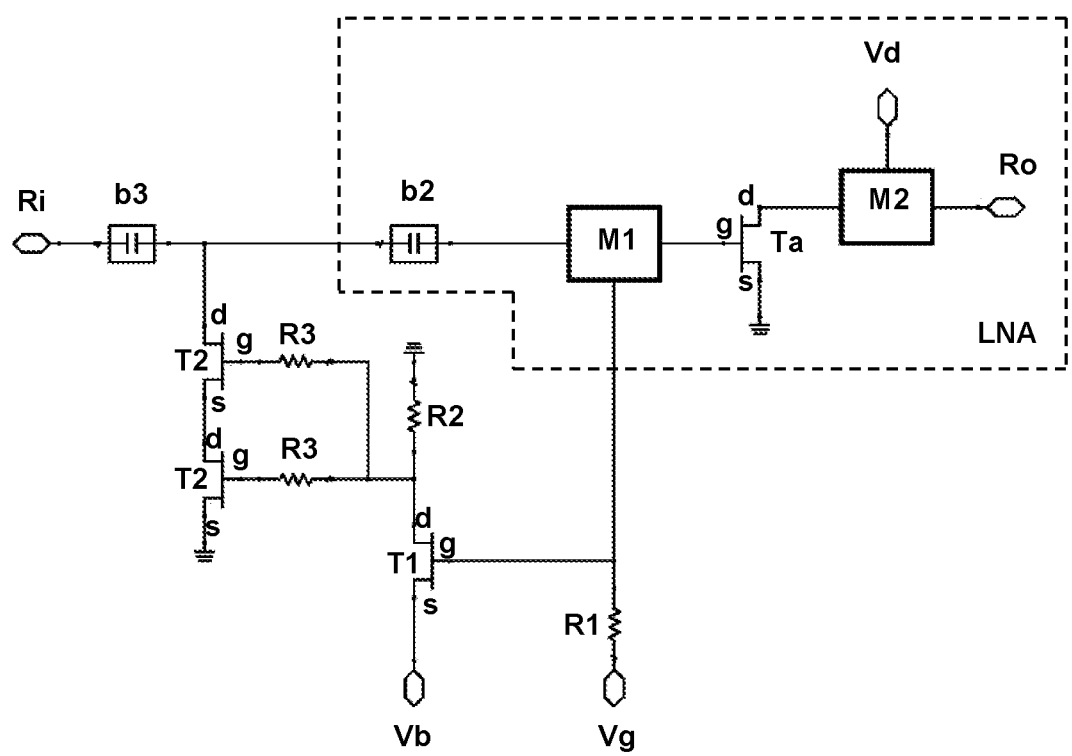
FIG. 3 shows another exemplary circuit diagram of the active limiting system of the present application.

An alternative embodiment of the present application is shown in FIG. 3. In this embodiment, active limiting system comprises at least one first switch (T1), which is preferably in the form of HEMT, having at least one source (s), at least one gate (g) and at least one drain (d) source (s) of which is connected to a bias voltage (Vb), wherein electrical connection between the source (s) and drain (d) of the first switch (T1) is controlled by the gate (g) to source (s) voltage of the first switch (T1); at least first resistor (R1) which is connected between the gate (g) of the first switch (T1) and a gate voltage (Vg); at least one second resistor (R2), which is connected between the ground and drain (d) of the first switch (T1); at least one second switch (T2), which is preferably in the form of HEMT, having at least one source (s), at least one gate (g) and at least one drain (d), source (s) of which is connected to the ground and drain (d) of which is connected to a signal input (Ri), wherein electrical connection between the source (s) and drain (d) of the second switch (T2) is controlled by the gate (g) to source (s) voltage of the second switch (T2); at least one third resistor (R3) which is connected between the drain (d) of the first switch (T1) and gate (g) of the second switch (T2). In this embodiment, gate (g) of the first switch (T1) is suitable to be connected to an amplifier transistor (Ta) of a low noise amplifier (LNA), through a first matching network (M1). Preferably, active limiting system comprises at least two second switch (T2) and at least two third resistor (R3), as shown in FIG. 3. In this embodiment, by using more than one second switch (T2), parasitic effects of the second switches (T2) are reduced.

In the present application, by using first switch (T1) and second switch (T2), when a low power voltage signal is received from the signal input (Ri), said signal is directly sent to the low noise amplifier (LNA). On the other hand, when a high power voltage signal is received from the signal input (Ri), said high power reflected back. Therefore, low noise amplifier (LNA) is able to be protected from the high power signals.

What is claimed is:

1. An active limiting system to protect a low noise amplifier against high power signals received from a signal input, comprising:
   at least one first switch having at least one source, at least one gate and at least one drain; wherein the source of the at least one first switch is connected to a gate voltage, wherein an electrical connection between the source and the drain of the at least one first switch is controlled by a gate to source voltage of the first switch;
   at least one first resistor is connected between the gate and the source of the at least one first switch;
   at least one second resistor is connected between a drain voltage and the drain of the at least one first switch;

at least one second switch having at least one source, at least one gate and at least one drain, the source of the at least one second switch is connected to the drain voltage and the drain of the at least one second switch is connected to a signal input, wherein an electrical connection between the source and the drain of the second switch is controlled by a gate to source voltage of the at least one second switch;

at least one third resistor is connected between the drain of the at least one first switch and the gate of the at least one second switch;

at least one first filtering element blocks DC currents/voltages and the at least one first filtering element is connected between the source of the second switch and a ground.

2. The active limiting system according to claim 1, wherein, the at least one first switch is a high-electron-mobility transistor (HEMT).

3. The active limiting system according to claim 1, wherein, the at least one second switch is a high-electron-mobility transistor (HEMT).

4. The active limiting system according to claim 1, wherein, the active limiting system comprises at least two second switch and at least two third resistors.

5. The active limiting system according to claim 1, further comprising, at least one voltage damper located between the at least one second resistor and the drain of the at least one first switch.

6. The active limiting system according to claim 5, wherein, the voltage damper comprises at least one diode.

7. An active limiting system to protect a low noise amplifier against high power signals received from a signal input, comprising:

at least one first switch, having at least one source, at least one gate and at least one drain, wherein the source of the at least one first switch is connected to a bias voltage, wherein an electrical connection between the source and the drain of the at least one first switch is controlled by a gate to source voltage of the first switch;

at least one first resistor is connected between the gate of the at least one first switch and a gate voltage;

at least one second resistor is connected between a ground and the drain of the at least one first switch;

at least one second switch, having at least one source, at least one gate and at least one drain, the source of the at least one second switch is connected to the ground and the drain of the at least one second switch is connected to a signal input, wherein an electrical connection between the source and the drain of the second switch is controlled by a gate to source voltage of the at least one second switch;

at least one third resistor is connected between the drain of the at least one first switch and the gate of the at least one second switch.

8. The active limiting system according to claim 7, wherein, the active limiting system comprises at least two second switch and at least two third resistors.

* * * * *